US008319334B2

(12) United States Patent
Standing

(10) Patent No.: US 8,319,334 B2
(45) Date of Patent: Nov. 27, 2012

(54) EMBEDDED LAMINATED DEVICE

(75) Inventor: Martin Standing, Villach (AT)

(73) Assignee: Infineon Technologies AG, Neubiberg (DE)

( * ) Notice: Subject to any disclaimer, the term of this patent is extended or adjusted under 35 U.S.C. 154(b) by 413 days.

(21) Appl. No.: 12/538,470

(22) Filed: Aug. 10, 2009

(65) Prior Publication Data
US 2011/0031611 A1    Feb. 10, 2011

(51) Int. Cl.
*H01L 23/12* (2006.01)
*H01L 21/00* (2006.01)
(52) U.S. Cl. ......... 257/700; 257/E23.142; 257/E23.145; 436/121
(58) Field of Classification Search ............ 257/E23.142
See application file for complete search history.

(56) References Cited

U.S. PATENT DOCUMENTS

| | | | |
|---|---|---|---|
| 5,426,263 A * | 6/1995 | Potter et al. ................ | 174/558 |
| 7,473,988 B2 | 1/2009 | Urashima et al. | |
| 2004/0188827 A1* | 9/2004 | Akashi ........................ | 257/700 |
| 2006/0060954 A1 | 3/2006 | Meyer-Berg | |
| 2007/0108585 A1* | 5/2007 | Pavier et al. ................ | 257/690 |
| 2007/0132091 A1 | 6/2007 | Wu et al. | |
| 2007/0262430 A1 | 11/2007 | Ibaraki | |
| 2008/0123302 A1 | 5/2008 | Kawano et al. | |
| 2009/0041994 A1 | 2/2009 | Ockenfuss et al. | |

FOREIGN PATENT DOCUMENTS

| | | |
|---|---|---|
| DE | 102006005420 | 9/2007 |
| DE | 102008035911 | 4/2009 |
| DE | 102008062498 | 7/2009 |
| DE | 102009040557 | 5/2010 |
| EP | 0 528 001 | 6/1996 |
| WO | 2007/119877 | 10/2007 |

OTHER PUBLICATIONS

"Embedded Die Technology, Next Generation Packaging for Discrete Semiconductors", Wil Peels, et al., NXP Semiconductors pp. 5 (Oct. 8, 2008).

* cited by examiner

*Primary Examiner* — Daniel Whalen
(74) *Attorney, Agent, or Firm* — Dicke, Billig & Czaja, PLLC

(57) ABSTRACT

An electronic device includes at least one semiconductor chip, each semiconductor chip defining a first main face and a second main face opposite to the first main face. A first metal layer is coupled to the first main face of the at least one semiconductor chip and a second metal layer is coupled to the second main face of the at least one semiconductor chip. A third metal layer overlies the first metal layer and a fourth metal layer overlies the second metal layer. A first through-connection extends from the third metal layer to the fourth metal layer, the first through-connection being electrically connected with the first metal layer and electrically disconnected from the second metal layer. A second through-connection extends from the third metal layer to the fourth metal layer, the second through-connection being electrically connected with the second metal layer and electrically disconnected from the first metal layer.

20 Claims, 7 Drawing Sheets

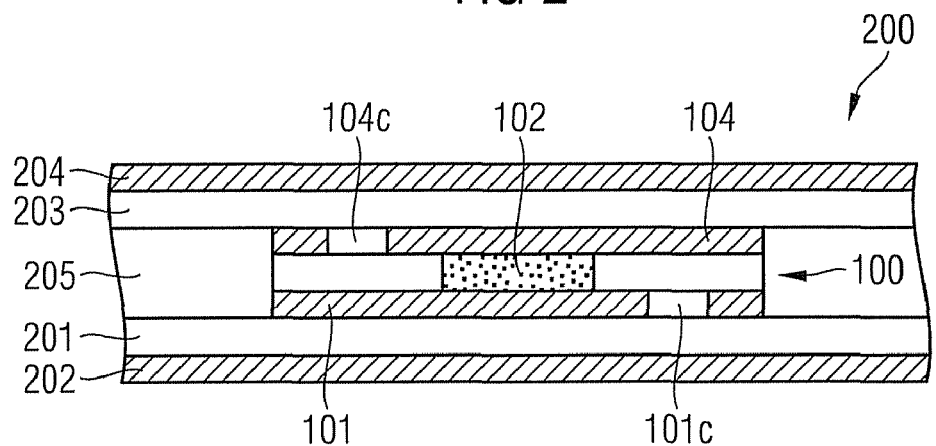
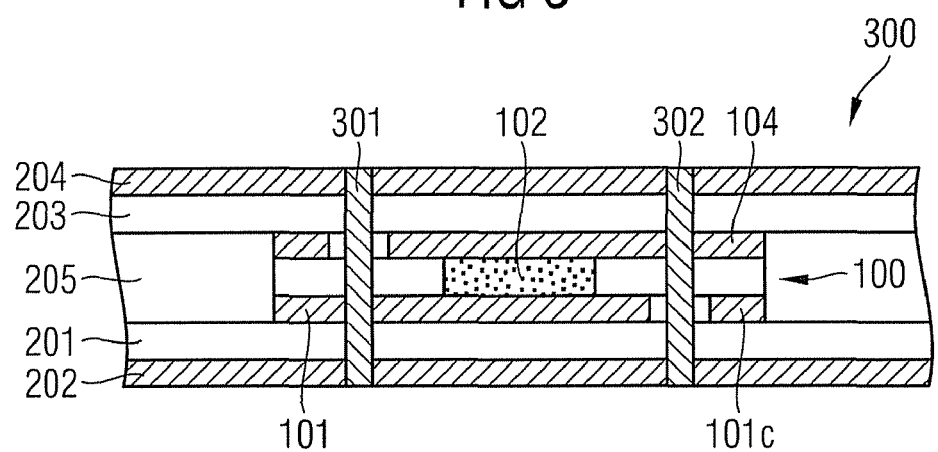

EMBEDDED LAMINATED DEVICE

BACKGROUND

One aspect relates to electronic devices, and more particularly to the technique of embedding semiconductor components into a substrate such as e.g., into a printed circuit board.

Embedding semiconductor devices into a substrate has been realized as a promising technology for applications in which size, thickness and weight of electronic devices are sought to be minimized. Such requirements are often encountered in portable applications such as cell-phones, laptop PCs, palms, PDUs (Personal Digital Assistant) etc., and are also of relevance in other electronic applications such as power devices.

Recently, semiconductor chips have been directly embedded into build-up layers of SBU (Sequential Build-up) laminate substrates and in PCBs (printed circuit boards). Promising embedded actives technologies should allow for low production costs, an efficient electrical connection method and high versatility in view of circuit design and routing capability.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

FIG. 2 is a sectional view of a laminate insert package embedded in a layer stack substrate.

FIG. 3 is a sectional view of an embodiment of an electronic device including a laminate insert package embedded in a layer stack substrate.

DETAILED DESCRIPTION

Figure 1A:
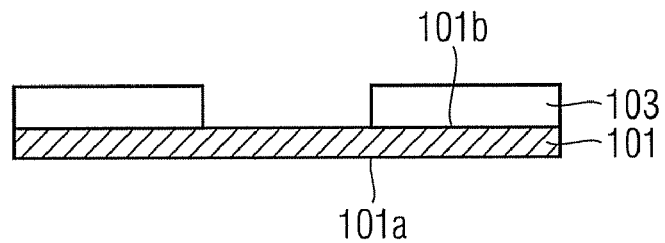
FIGS. 1A to 1D are sectional views illustrating an embodiment of a process flow for producing an embodiment of a laminate insert package.
Figure 1B:
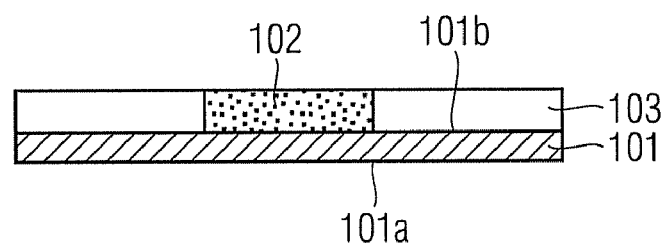

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are illustrated in schematic form in order to facilitate describing one or more aspects of the embodiments. The following description is therefore not to be taken in a limiting sense, and the scope is defined by the appended claims. It should also be noted that the representations of the various layers, sheets or substrates in the Figures are not necessarily to scale.

In the following detailed description, reference is made to the accompanying drawings, which form a part thereof, and in which is illustrated by way of illustration specific embodiments in which the invention may be practiced. In this regard, directional terminology, such as e.g., "upper", "lower", "top", "bottom", "left-hand", "right-hand", "front side", "backside", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The semiconductor chips described further below may be of different types, may be manufactured by different technologies and may include for example integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or micro-electromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in one embodiment on its two main surfaces, that is to say on its front side and backside. In one embodiment, power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals.

Furthermore, the semiconductor chips described herein may include contact elements or contact pads on one or more of their outer surfaces wherein the contact elements serve for electrically contacting the semiconductor chips or other circuits integrated in the semiconductor chip. The contact elements may have the form of lands, i.e. flat contact layers on an outer surface of the semiconductor chip. The contact elements may be situated on the active main surfaces of the semiconductor chips or on other surfaces of the semiconductor chips or on both surfaces.

One or more semiconductor chips are embedded in a laminate insert package. Embodiments of the laminate insert package having a plurality of chips may use different types of chips such as e.g., the types mentioned above as well as integrated passives, passives etc.

The laminate insert package is embedded in a substrate including a layer stack to form an electronic device. The layer stack may generally be made from a number of layers that are insulating or conductive, the latter are provided with a conductor track structure. Embodiments of the substrate may include substrates of different type and configuration, in one embodiment PCBs (Printed Circuit Boards) and SBU (Sequential Build-Up) laminate substrates. The laminate insert package may thus form a laterally confined "laminate-in-laminate" structure within a subregion of the substrate. Thus, at least parts of the conductive metal layers of the layer stack may extend laterally outside the subregion to which the lateral extension of the laminate insert package is confined. Further, in general, the number and positions of conducting and/or insulating layers of the laminate insert package must not correspond to the number and positions of adjacent conducting and/or insulating layers of the layer stack.

A variety of electronic devices may be produced by the technique described herein. By way of example, the electronic device may constitute a power supply containing one or more power MOSFETs or a motherboard of a computer etc.

In several embodiments of laminate insert packages and electronic devices, layers or layer stacks are applied to one another or materials are applied or deposited onto layers. It should be appreciated that any such terms as "applied" or "deposited" are meant to cover literally all kinds and techniques of applying layers onto each other. In one embodiment, they are meant to cover techniques in which layers are applied at once as a whole like, for example, laminating techniques as well as techniques in which layers are deposited in a sequential manner like, for example, printing, sputtering, plating, dispensing, molding, CVD (Chemical Vapor Deposition), etc.

The laminate insert package and the layer stack of the substrate include metal layers used as wiring layers to make electrical contact with the semiconductor chip. The metal layers may be manufactured with any desired geometric shape and any desired material composition. The metal layers may, for example, be composed of conductor tracks or wires, but may also be in the form of a layer covering an area. Any desired metal, for example copper, aluminum, nickel, palladium, silver, tin or gold, or metal alloy may be used as the material. The metal layers need not be homogenous or manufactured from just one material, that is to say various compositions and concentrations of the materials contained in the metal layers are possible, and different metal layers may be of different materials.

FIGS. 1A-D illustrate processes of a first embodiment of a method of producing an insert package 100 intended for integration in a layer stack. It is to be noted that the stages of production illustrated in FIGS. 1A-D may be understood as simplifications since further layers such as dielectric layers, adhesive layers etc. may be used which are not depicted in these figures.

The process may start with a first metal layer or foil 101 which may be made of copper or any other appropriate conductive material. For instance, the first metal foil 101 may be similar to that conventionally used to produce a PCB laminate.

The first metal foil 101, e.g., copper foil, may be finished with an optional organic coating (not illustrated) on the bottom surface 101*a* and with an optional chemical preparation (not illustrated) on the top surface 101*b*. The chemical preparation may virtually consist of a chemical roughening of the top surface 101*b*. The first metal foil 101 is intended to provide a surface (namely top surface 101*b*) that will suit the requirements for connection of a die, i.e. may act similar to a leadframe. Further, as will be explained in greater detail in conjunction with FIG. 4B, the first metal foil 101 may optionally be coated with a dielectric layer (not illustrated) that may be printed selectively on the top surface 101*b* of the first metal foil 104.

As illustrated in FIG. 1A, a structured first insulating layer 103 is then applied to the top surface 101*b* of the first metal foil 101. In one embodiment this first insulating layer 103 may e.g., be manufactured from pre-cut solid material such as e.g., a plastic structure with or without reinforcement or a prepreg structure, the structure having a window corresponding in size to the lateral dimensions of a semiconductor die or chip 102 to be applied. As known in the art, prepreg layers are made of an uncured resin material that liquefies and then cures upon compression or lamination of the structure. In another embodiment, the first insulating layer 103 may be selectively printed using a screen, stencil or jet printing technique. As the purpose of the first insulating layer 103 is to act as a spacer for the thickness of the semiconductor chip 102, the printing image matches the perimeter of the semiconductor chip 102. In all embodiments, the thickness of the first insulating layer 103 may be about the same as the thickness of the semiconductor chip 102.

A die or semiconductor chip 102 is then bonded to the first metal foil 101 and thereby electrically connected thereto. Bonding may be accomplished by a variety of techniques such as gluing with a conductive adhesive, bonding with a low temperature conductive sintering material, soldering etc. As will be explained later in more detail by way of example, a metal (e.g., silver) particle filled epoxy or another conducting polymer may be used for fixing the semiconductor chip 102 to the first metal foil 101. Such polymer may be applied in liquid form by a printing process such a screen printing, stencil printing or jet printing, or by a dispensing method.

It is to be noted that it may also be possible to first apply the semiconductor chip 102 and then to apply the structured first insulating layer 103. The above-mentioned chemical preparation of the top surface 101*b* of the first metal foil 101 may depend on the constitution of the first insulating layer 103 and is designed to give good adhesion to the first insulating layer 103.

A second metal foil 104 may be made of the same material and may be processed in the same manner as the first metal foil 101. In other words, a first surface 104*a* of the second metal foil 104 may be finished with an organic coating (not illustrated) and a second surface 104*b* of the second metal foil 104 may be subjected to a chemical preparation (not illustrated). Further, as mentioned already above in conjunction with FIG. 1A, the second metal foil 104 may also be coated with a dielectric layer (not illustrated) that may be printed selectively on the second surface 104*b* of the second metal foil 104.

In one embodiment, the semiconductor chip 102 is bonded to the second metal foil 104 rather than to the first metal foil

101. All bonding methods as mentioned above may be applied. In this case, the first metal foil 101 carries the first insulating layer 103 acting as a spacer and the second metal foil 104 carries the semiconductor chip 102 (or multiple semiconductor chips).

Figure 1C:
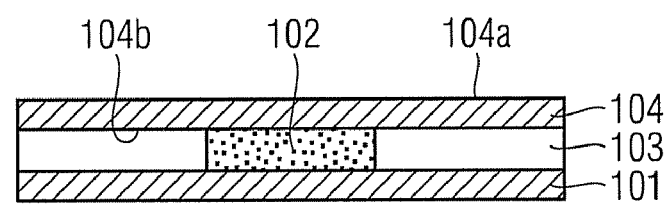

In a later stage of the assembly process, as illustrated in FIG. 1C, the two foil assemblies a brought together and integrated to form a compound structure by e.g., the use of a lamination press. The lamination press (not illustrated) clamps the foil assemblies at e.g., a constant pressure within e.g., a vacuum environment. The temperature within the lamination press may be profiled to create appropriate conditions for the resin to flow to a limited degree before the resin materials in the compound starts to cure. This way, a solid rigid laminated body is obtained in which the semiconductor chip 102 is sandwiched between two metal foils 101, 104 and electrically contacted to these foils 101, 104. As will be explained later in greater detail, if e.g., a conducting adhesive is used as a bonding material between semiconductor chip 102 and metal foils 101, 104, the electrical contact to the semiconductor chip 102 may be generated by the lamination process.

By way of example, if the semiconductor chip 102 is a power device, the gate contact and the source contact may be contacted down on the first metal foil 101 and then the drain contact will be bonded to the second metal foil 104. Without saying, other types of semiconductor chips forming vertical devices or semiconductor chips 102 which do not form vertical devices may be used.

Once the laminated body has been created, the first and/or second metal foils 101, 104 may be structured into the desired electrical conductor patterns. The electrical conductor patterns extend laterally beyond the outline or perimeter of the semiconductor chip 102 and are provided in the semiconductor chip outside region with metal-free areas or openings 101*c* and 104*c*, respectively. Opening 101*c* is positioned opposite (in terms of a protection normal to the lamination plane) to a metal area of the electrical conductor pattern formed from the second metal foil 104. Vice versa, opening 104*c* is positioned opposite (in terms of a protection normal to the lamination plane) to a metal area of the electrical conductor pattern formed from the first metal foil 101.

The laminated body with patterned metal foils 101, 104 will be referred to in the following as (laminated) insert package 100. As will be explained in more detail further below, a plurality of insert packages 100 may simultaneously be generated from a single laminate panel including a repetitive structure of insert packages 100. In this case, all aforementioned processes are performed on laminate panel level. The number of insert packages 100 in one laminate panel will depend on the overall laminate panel size and the size of the insert package 100. The size of the insert package 100 may depend on the number of semiconductor chips which are embedded in one insert package 100 (i.e. single chip as depicted by way of example in FIG. 1D or multi-chip as will be explained later). Thus, the insert package 100 may either include number of semiconductor chips 102 and/or passives and at least a partial electrical interconnect structure or may simply include one semiconductor chip 102 and the terminals thereof.

Figure 1D:
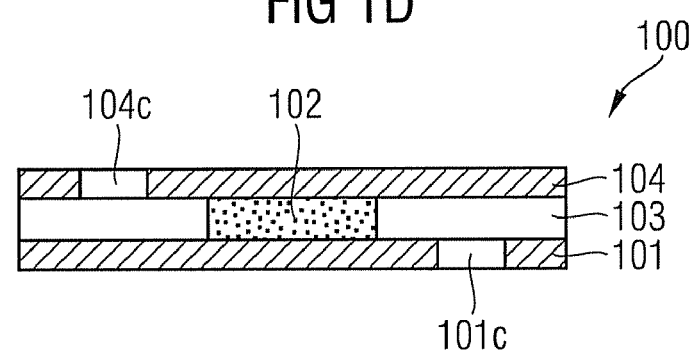

The insert packages 100 may be tested within the laminate panel. After testing, the laminate panel may be singularized into single insert packages 100 by e.g., sawing or other dicing techniques. The insert package 100, as illustrated in FIG. 1D, may then represent a final product which may be purchased by the customer and integrated into the PCB or SBU during the lamination process. Note that the insert package 100 may have a simple plate-type geometrical shape such as e.g., a polygon having two parallel, flat surfaces formed by the patterned first and second metal foils 101, 104.

It is to be noted that the unembedded insert package 100 may fail to have any electrical couplings between the electrical conductor patterns formed from the first metal foil 101 and the electrical conductor patterns formed from the second metal foil 104 (except the semiconductor chip(s) 102 bonded between the first and second metal foils 101, 104). In one embodiment, the insert package 100 may fail to have any through-holes or vias that electrically interconnect conductor structures or lands patterned from the first and second metal foils 101, 104.

One or more laminate insert packages 100 are then integrated into a layer stack substrate to form an electrical device in the form of an electrical circuit. FIG. 2 is a sectional view showing the laminate insert package 100 integrated into a layer stack substrate 200. By way of example, the layer stack substrate 200 may be a PCB. The laminate insert package 100 can easily be integrated into the PCB 200 because it can be treated as any other internal layer of the PCB 200 and only requires an aperture to be cut into an existing layer such as e.g., a prepreg layer (i.e. an uncured resin layer) or a core layer (i.e. a cured resin layer) of the PCB 200 to allow the insert package(s) 100 to be integrated in the PCB 200 lamination structure.

More specifically, the PCB 200 may for instance be made of a first substrate insulating layer 201, a first substrate metal layer 202 bonded to the first substrate insulating 201, a second substrate insulating layer 203 and a second substrate metal layer 204 bonded to the second substrate insulating layer 203. Further, the PCB 200 may include an embedding insulating layer 205 which is designed to have an aperture which matches with the lateral dimensions of the laminate insert package 100. The embedding insulating layer 205 may be made of known prepreg materials on the basis of epoxy, polyester or other plastic materials, for instance cotton paper reinforced epoxy, woven glass reinforced epoxy, matte glass reinforced polyester, woven glass reinforced polyester, etc. Core layers made e.g., of fluoropolymer material such as e.g., polytetrafluoroethylene, aramid fibres or carbon fibres may also be used to serve as embedding insulating layer 205. The embedding insulating layer 205 may be the center insulating layer or may be one of the out-center insulating layers of the layer stack substrate 200. As already mentioned, it is to be noted that the insert package 100 may have a constant thickness over its lateral dimensions such that the thickness of the embedding insulating layer 205 may be designed to match with the thickness of the laminate insert package 100.

The first and second substrate insulating layers 201, 203 may for example be made of conventional interlayer dielectrics such as e.g., polytetrafluoroethylene or other appropriate materials.

The layer stack substrate (e.g., PCB) 200 is, by way of example, depicted to include only two substrate metal layers 202, 204. In this case, the substrate metal layers 202, 204 are outer (i.e. exposed) layers which may be structured after lamination of the layer stack substrate 200. However, the layer stack substrate (e.g., PCB) 200 may also be a multi-layer PCB type substrate. Multi-layer PCBs are formed by bonding together a plurality of substrate insulating layers (prepreg and core layers) and internally structured substrate metal layers bonded to the substrate insulating layers (typically to the core layers).

Generally, the layer stack substrate 200 embedding the laminate insert package 100 may be regarded as a laminate-in-laminate structure, in which the embedded laminate (i.e.

the insert package laminate 100) is laterally confined to extend only in a subregion of the surface extent of the layer stack substrate 200. Or, taking another point of view, the layer stack substrate 200 embedding the insert package 100 may be regarded as an n-layer board (n is the number of full-area substrate metal layers 202, 204) which, in a subregion, is provided with k additional metal layers 101, 104 and one or more semiconductor chips 102 which are directly coupled (i.e. fixed) to some or all of these k additional metal layers. Thus, the laminate insert package 100 may effectively transform the n-layer board 200 locally to an n+k layer board within a subregion where enhanced functionality is to be integrated. In another embodiment, also substrate metal layers may be effected (i.e. cut out) by the integration of the laminate insert package 100.

FIG. 3 illustrates an electronic device 300 made by electrically connecting the laminate insert package 100 to the layer stack substrate (e.g., PCB) 200. To this end, the design of the laminate insert package 100 and in one embodiment the location of the openings 101c and 104c of the first and second metal foils 101, 104, respectively, allows for electrically connecting the laminate insert package 100 by global vias 301, 302 (i.e. through-connections running from one side of the layer stack substrate 200 to the other side of the layer stack substrate 200). Global vias 301, 302 (which completely penetrate the layer stack substrate 200) may be generated by laser-drilling or conventional drilling. The hole may then be made conductive by through hole plating. Generally, these global vias are inexpensive compared to other types of vias as multiple layer stack substrates 200 can be drilled in a stack meaning that several layer stack substrates 200 can be drilled in a single operation.

In one embodiment, the laminate insert package 100 is electrically connected to the layer stack substrate 200 exclusively by global vias 301, 302. This does not necessarily exclude that blind vias (which connect an internal metal layer to an outer metal layer) or buried vias (which connect two internal metal layers) are provided in the electronic device 300 in other regions. However, in one embodiment, only global vias are used for interconnecting substrate metal layers 202, 204 of the layer stack substrate 200 and for interconnecting the laminate insert package 100 to the layer stack substrate 200.

It is to be noted that the possibility to exclusively use global vias 301, 302 for electrically connecting the insert package 100 is achieved by the specific design of the electrical conductor patterns of the first and second metal foils 101, 104 of the laminate insert package 100. Thus, in practice, the layer stack substrate manufacturer, who has to design the electronic device 300 and in one embodiment the global vias 301, 302, will work in collaboration with an insert package designer who is in charge of structuring the first and second metal foils 101, 104 to electrical conductor patterns including the openings 101c and 104c, respectively, at the right places.

In general terms, referring to the electronic device 300 depicted in FIG. 3, when producing the global vias 301, 302, they are positioned to meet or intersect metal layers where a connection is required and to miss metal layers where no connection is desired. So whilst a global via 301, 302 may go through a number of physically present metal layers, it is not necessarily connected to all of these layers. In this way, a part or all of the necessary electrical connections in the electronic device 300 may be made exclusively by global vias.

In one embodiment, the substrate 300 may be an SBU laminate substrate. An SBU laminate substrate may include a core that is similar to the design of a PCB 200 (with integrated insert package) as illustrated in FIG. 2. However, in SBU laminate substrates the core (corresponding to PCB 200) is covered on one or both sides by build-up layers which typically are formed by applying alternating dielectric films and metallizations to the core. These build-up layers may be formed by thin-film techniques such as lithography and etching and typically serve to provide additional rewiring structures to the PCB. If the insert package 100 is integrated in an SBU laminate substrate, again exclusively global vias may be used to electrically contact the laminate insert package 100 to the SBU laminate substrate.

Further, it is to be noted that the concept of integrating the laminate insert package 100 into a layer stack substrate (such as e.g., a PCB or a SBU laminate substrate) does not prohibit the use of heat-sinks The laminate insert package 100 may occupy a layer very close to the surface of the layer stack substrate. If a common node is chosen then the common node may be connected to one surface (e.g., first or second substrate metal layer 202, 204) and a heat-sink can be soldered or directly connected to that surface without the need for electrical isolation. Further, thermal planes of relatively heavy weight copper may also be used as part of the electronic device 300 for the purpose of heat-sinking.

FIGS. 4A-4J illustrate stages of a method of producing an embodiment of a laminate insert package 400. It is to be noted that the method illustrated in FIGS. 4A-4J is, to some extent, similar to but somewhat more detailed than the process flow described in conjunction with FIGS. 1A-1D. Thus, it is to be understood that details in the embodiment described below may be applied to the process flow of the embodiment illustrated in FIGS. 1A-1D and vice versa.

Figure 4A:
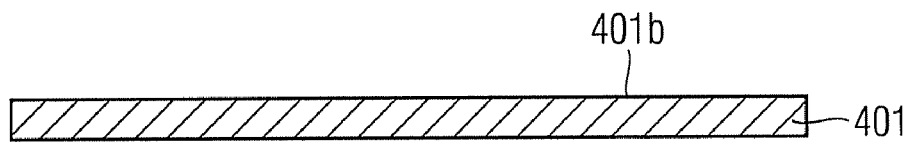
FIGS. 4A to 4J are sectional views illustrating an embodiment of a process flow for producing an embodiment of a laminate insert package.

In a first step, a first metal layer or foil 401 is provided (FIG. 4A). The first metal foil 401 corresponds to the first metal foil 101 of the aforementioned embodiment.

Figure 4B:
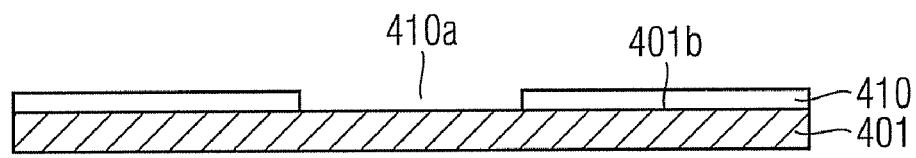

Then, as illustrated in FIG. 4B, a first dielectric layer 410 is applied to the top surface 401b of the first metal foil 401. The first dielectric layer 410 may be selectively printed on the top surface 401b by using a screen, stencil or jet printing method, or a dispensing process. At open areas 410a of the first dielectric layer 410, the top surface 401b of the first metal foil 401 remains exposed.

Figure 4C:
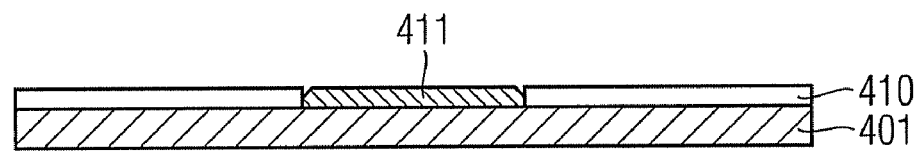

The open area(s) 410a within the first dielectric layer 410 may then be filled with a bonding material such as e.g., a conducting adhesive, bonding with low temperature sintering material or solder (FIG. 4C). Here, by way of example, a conducting adhesive 411 is applied. The conducting adhesive 411 may be applied in the same manner as the first dielectric layer 410, e.g., as a liquid by using printing or dispensing techniques. The conducting adhesive 411 may, for instance, be made of a metal particle filled epoxy. It is possible to use B stage epoxy materials or similar multi-stage curing system adhesives. By way of example, polyimides, bismaleimides etc. could be used as adhesives. Further, by way of example, silver may be used for the metal particles. The metal particle filled epoxy may be dried after the printing and may be solid at room temperature.

Figure 4D:
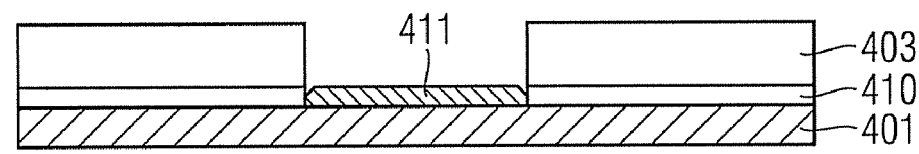

As illustrated in FIG. 4D, an insulating spacer layer 403 corresponding to the first insulating layer 103 in the aforementioned embodiment is applied on the first dielectric layer 410. The insulating spacer layer 403 is made and applied by any of the techniques described before, and reference is made to the corresponding description to avoid reiteration.

Figure 4E:
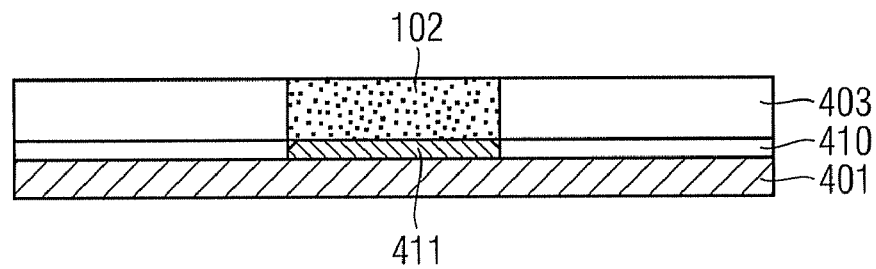
Figure 4F:
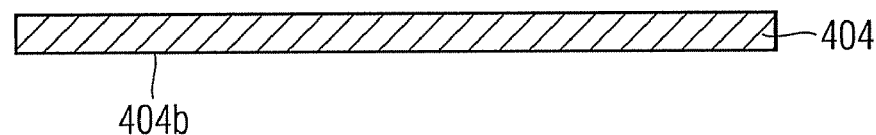
Figure 4G:
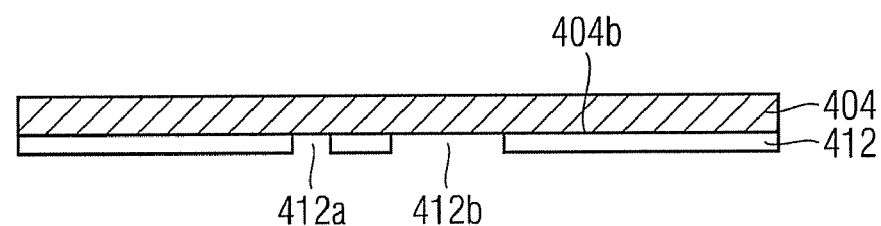
Figure 4H:
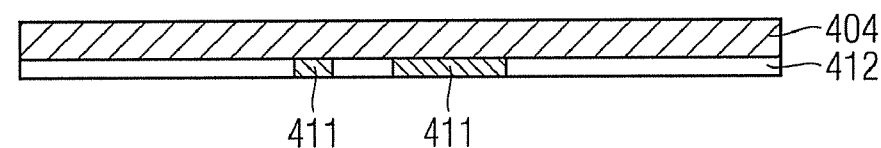

As illustrated in FIG. 4E, a semiconductor chip 102 is placed on the conducting adhesive 411. The use of a polymer such as a resin which is solid at room temperature (after drying) means that the resin will become sticky at increased temperatures. Modestly increasing the temperature to e.g., about 80° C. will allow processes such as hot-bonding to be used to fix the semiconductor chip 102 to the first metal foil 401. Hot-bonding involves either the first metal foil 401 or the semiconductor chip 102 to be heated up to make the resin of the conducting adhesive 411 tacky at the area where the semiconductor chip 102 is to be bonded. Once the semiconductor chip 102 has been placed and the assembly is cool again, then the resin of the conducting adhesive 411 solidifies and the assembly can easily be handled again.

Figure 4I:
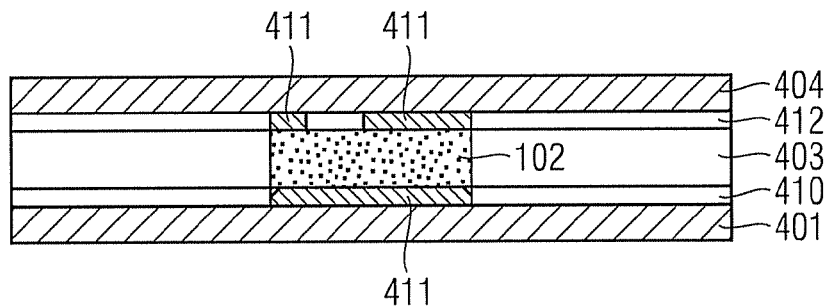

According to one embodiment, the final layer structure illustrated in FIG. 4I may be built up layer by layer from the bottom of the structure to the top. However, FIGS. 4F-4H exemplify, by way of example, an alternative process flow. According to FIG. 4F, a second metal foil 404 corresponding to the second metal foil 104 of the aforementioned embodiment is provided. Then, similar to FIG. 4B and the corresponding description, a second structured dielectric layer 412 is applied to a second surface 404b (corresponding to second surface 104b of the second metal foil 104 in the aforementioned embodiment) of the second metal foil 404. Again, the structured second dielectric layer 412 may be selectively applied e.g., by printing or dispensing processes or may be applied over the full area and then appropriately etched to establish open areas 412a, 412b by conventional technologies.

The open areas 412a and 412b may then be filled by a bonding material such as e.g., a conducting adhesive 411 in the same way as described before in conjunction with FIG. 4C. The pattern of the second dielectric layer 412 may correspond to the position(s) of die metal contact(s) on the semiconductor chip 102. By way of example, if the semiconductor chip 102 is a power MOSFET, the open area 412a may correspond to the gate contact, the open area 412b may correspond to the source contact and the open area 410a of the first dielectric layer 410 may correspond to the drain contact of the semiconductor chip 102.

As illustrated in FIG. 4I, the two assemblies are brought together and laminated in a lamination press (not illustrated). During lamination, the die metal contacts on the top side of the semiconductor chip 102 are mechanically and in an electrically conductive manner fixed to the second metal foil 404 by the conducting adhesive 411 in the open areas 412a, 412b of the second dielectric layer 412.

Figure 4J:
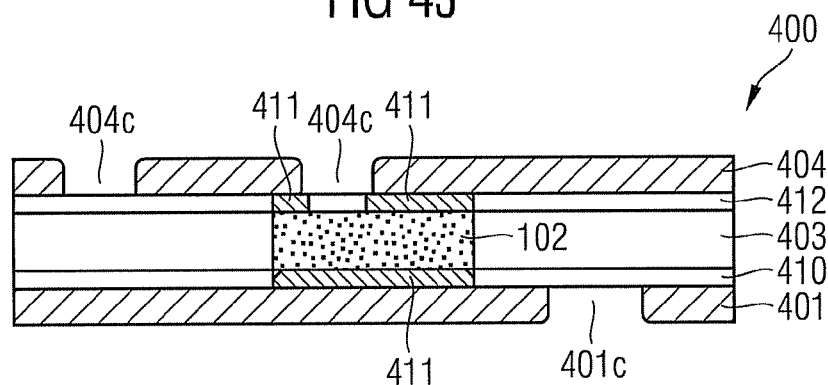

FIG. 4J illustrates a patterning of the first and second metal foils 401, 404. In this step, openings 401c and 404c are formed in the first and second metal foils 401, 404 by appropriate structuring techniques including e.g., photolithography and etching. Patterning may be configured to provide for conductor tracks, die pads or other structures connected or disconnected to the semiconductor chip(s) 102. In one embodiment, it is possible to produce insulated structures which are electrically disconnected from all other structures generated from the respective first or second metal foil 401, 404.

Similar to the aforementioned embodiment, a plurality of structures as illustrated in FIGS. 4A-4I are arranged in an extended laminate panel. FIGS. 5A-5E are perspective view showing stages of production of such laminate panel.

Figure 5:
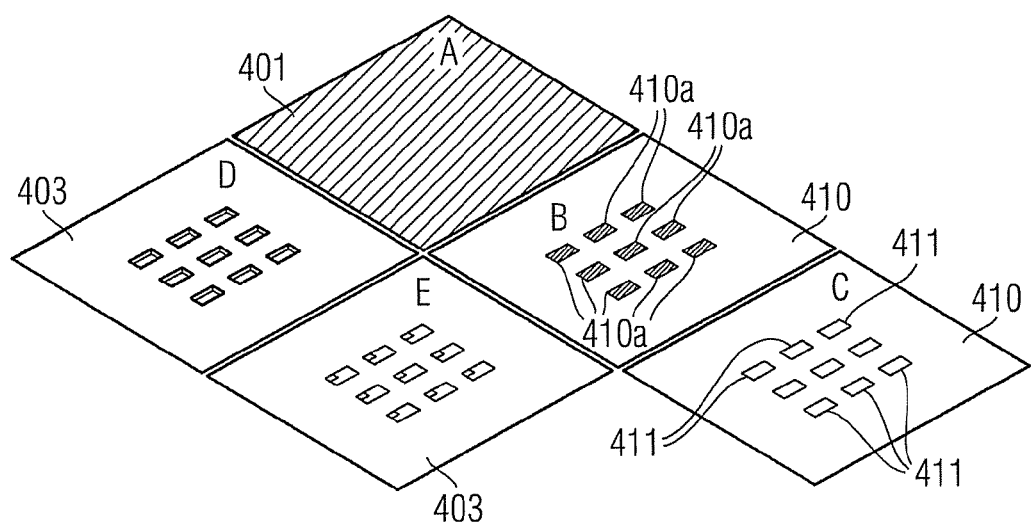
FIG. 5A to 5E are perspective views corresponding to FIGS. 4A to 4E, respectively.

FIG. 5A corresponds to FIG. 4A and illustrates the first metal foil 401 of the laminate panel.

FIG. 5B corresponds to FIG. 4B and illustrates the structured first dielectric layer 401 of the laminate panel including an array of open areas 410a.

FIG. 5C corresponds to FIG. 4C and illustrates the open areas 410a filled with the conducting adhesive 411.

FIG. 5D corresponds to FIG. 4D and illustrates the laminate panel once the insulating spacer layer 403 is applied.

FIG. 5E corresponds to FIG. 4E and illustrates the laminate panel after mounting the semiconductor chips 102 on the first metal foil 401.

The processes relating to the second metal foil 404 (FIGS. 4F-4H) are accomplished analogously to FIGS. 5A-5C on laminate panel level. The two laminate panels are then brought together and laminated in a lamination press to generate a laminated panel containing an array of the insert laminate structures as illustrated in FIG. 4I. Here, by way of example, the laminate panel contains an array of 9 insert laminate structures each including one semiconductor chip 102.

The subsequent steps of patterning the first and second metal foils 401, 404 on laminate panel level, testing the laminate insert packages 400 (e.g., still on laminate panel level) and dicing the laminate panel into single laminate insert packages 400 as illustrated in FIG. 4J have already been described in the context of the aforementioned embodiments and reference is made to these descriptions to avoid reiteration.

Figure 6:
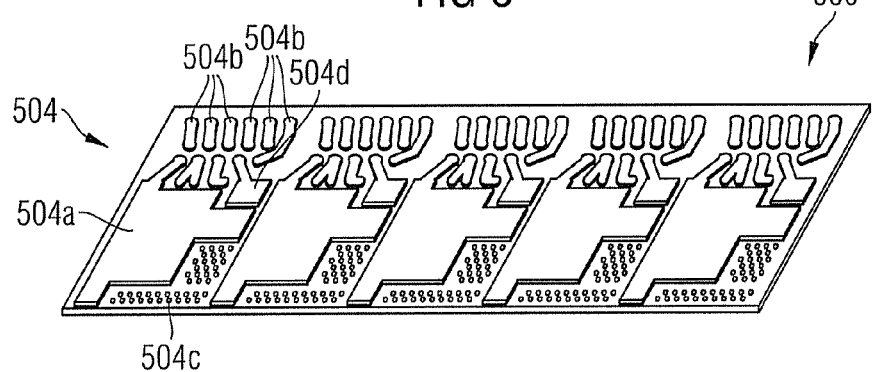
FIG. 6 is a top plan view of an embodiment of a laminate insert package.

FIG. 6 illustrates a plan view of the top side of a laminate insert package 500 according to one embodiment. The laminate insert package 500 implements a synchronous buck configuration which may e.g., be used as part of a voltage regulator or switch mode power supply circuit. Here, by way of example, a five phase synchronous buck configuration is displayed, which is composed of five identical structures arranged in the form of a linear array. As known in the art, each structure includes three semiconductor chips, namely two power MOSFETs arranged in a half-bridge configuration and one phase IC which controls the duty cycle of the structure under consideration. The plan view of FIG. 6 illustrates a structured top metal foil 504 which corresponds to the second metal foils 104 and 404 of the previous embodiments. Reference is made to the description of these embodiments in order to avoid reiteration. Briefly, foil area 504a may represent the phase output node, foil areas 504b may represent the input/output terminals of the phase IC and foil area 504d may be connected to the gate contact of one of the MOSFETs. However, many different designs of the pattern of the top metal foil 504 of the laminate insert package 500 are available.

Figure 7:
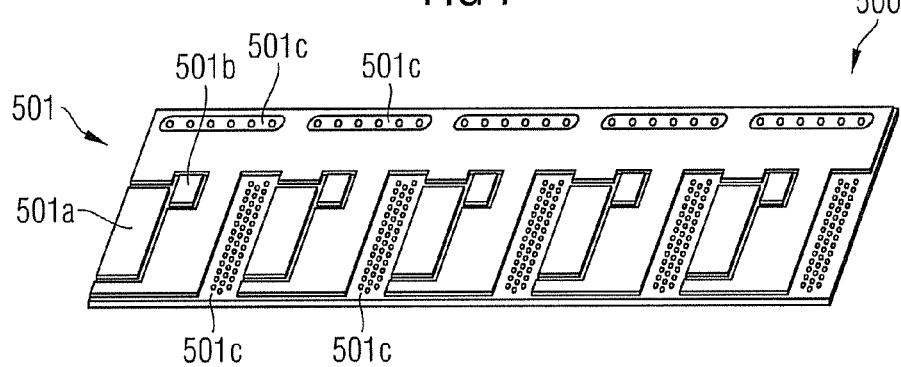
FIG. 7 is a bottom plan view of the embodiment of the laminate insert package as illustrated in FIG. 6.

FIG. 7 illustrates a structured bottom metal foil 501 of the laminate insert package 500. An isolated area 501a forms a die pad to be connected to e.g., the drain contact of a first of the power MOSFETs. The insular, isolated area 501b may be electrically connected to the gate contact of the second power MOSFET.

FIGS. 6 and 7 further demonstrate where through-vias may be implemented to connect the first and second structured metal foils 501, 504 to substrate metal foils after insertion and lamination of the laminate insert package 500 into a (e.g., customer's) layer stack substrate. The intended positions of the vias are depicted by dots which are confined to openings 501c and 504c of the bottom and top metal foils 501 and 504, respectively, which correspond to openings 401c and 404c of the respective metal foil 401, 404 as illustrated in FIG. 4J. Note that the intended positions of all global vias penetrating the laminate insert package 500 may connect only to one of the metal foils 501, 504 and not to the other. By way of example, in all cases, if a via is intended to connect to the bottom metal foil 501, it will penetrate through an opening 504c of the top metal foil 504 and therefore will not connect to the top metal foil 504. On the other hand, if a global via is intended to connect to the top metal foil 504, it will penetrate through an opening 501c of the bottom metal foil 501 in order to be not connected thereto. This concept has already been explained in the aforementioned embodiments and reference is made to this description for the sake of brevity. Further, it is to be noted that global vias will never actually be present prior to lamination of the laminate insert package into the customer's layer stack substrate. Therefore, the dots are merely provided for explanatory purposes and will represent the positions of vias rather than actual vias which are only present after finishing the electronic device.

Figure 8:
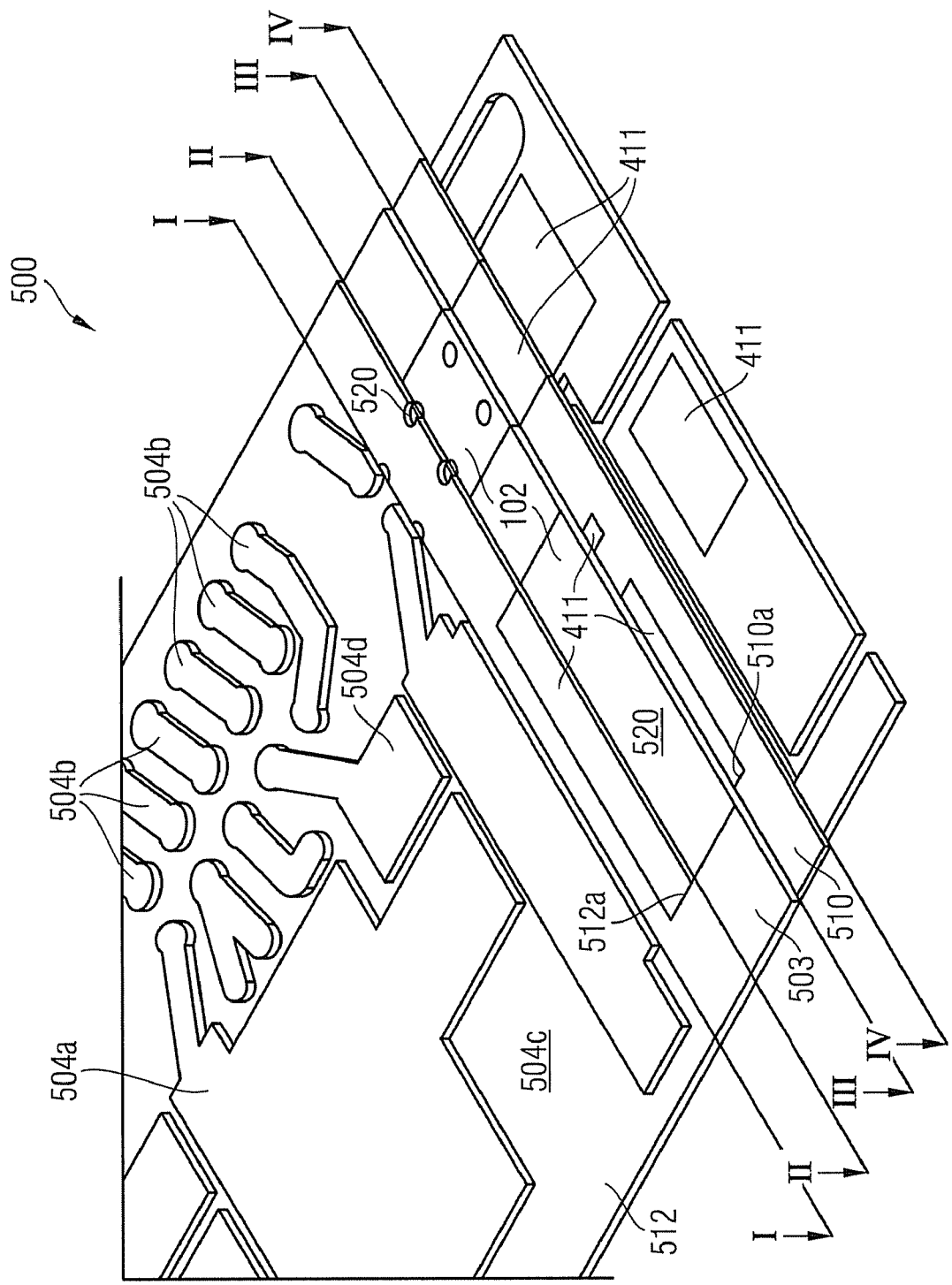
FIG. 8 is a partial plan view of the laminate insert package of FIGS. 6 and 7 showing the interior of the package at multiple partial section lines I-I to IV-IV.

FIG. 8 is a partial plan view of the laminate insert package 500 showing the interior of the package at multiple partial section lines I-I to IV-IV. Basically, the configuration of the laminate insert package 500 corresponds to the buildup of the laminate insert package 400. In the upper left region, the patterned top metal foil 504 can be seen. This foil 504 is placed on a top dielectric layer 512, which corresponds to the second dielectric layer 412 of the laminate insert package 400. At section line I-I the top metal foil 504 is cut down to the surface of the top dielectric layer 512. As a result, conducting adhesive 411 can be seen to fill an opening 512a of the top dielectric layer 512 corresponding to opening 412a of the laminate insert package 400.

At section line II-II the top dielectric layer 512 is cut down to the surface of an insulating spacer layer 503 corresponding to the insulating spacer layer 403 of the laminate insert package 400. Semiconductor chips 102 showing die metal contacts 520 become apparent.

At section line III-III the insulating spacer layer 503 as well as the semiconductor chips 102 are cut down to the surface of a bottom dielectric layer 510. The bottom dielectric layer 510 corresponds to the first dielectric layer 410 of the laminate insert package 400. Again, conducting adhesive 411 can be seen to fill open areas 510a (corresponding to open areas 410a) of the bottom dielectric layer 510.

At section line IV-IV the bottom dielectric layer 510 is cut down to the surface of the structured bottom metal foil 501. Lands of conducting adhesive 411 may be seen which are applied to areas where semiconductor chips (not illustrated in FIG. 9) are placed.

In all embodiments the thicknesses of the various insulating and conducting layers may cover a wide range. By way of example and without restriction on generality, the first or bottom metal foils 101, 401, 501 may have a thickness in the range between 30 to 80 μm, the first or bottom dielectric layer 410, 510 may have a thickness of about 10 to 20 μm, the first insulating or spacer layer 103, 403, 503 may have the same thickness as the semiconductor chip 102 (e.g., tens to hundreds of micrometers), the second or top dielectric layer 412, 512 may have a thickness of about 10 to 20 μm and the second or top metal foil 104, 404, 504 may have a thickness in the same range as the first or bottom metal foil 101, 401, 501.

Figure 9:
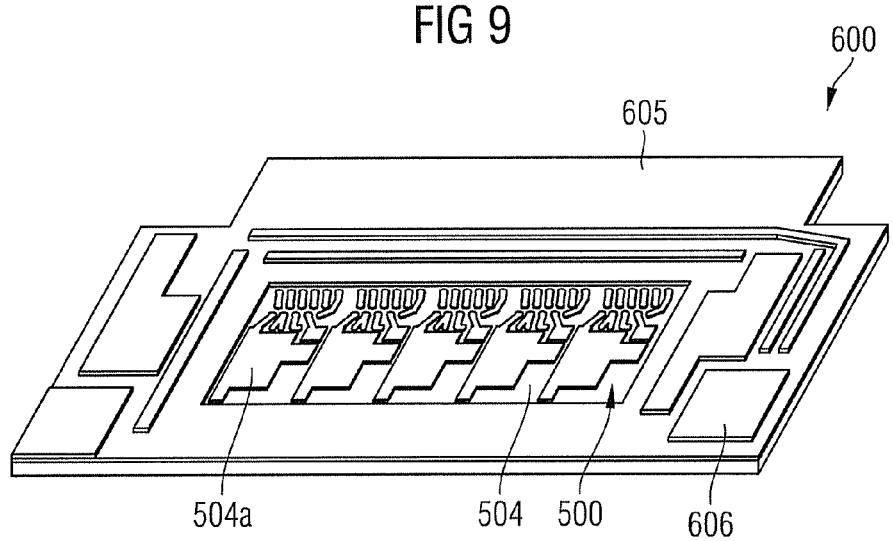
FIG. 9 is a plan view of the laminate insert package as illustrated in FIGS. 6 to 8 when inserted into a layer stack substrate to form an electronic device according to an embodiment.

FIG. 9 is a plan view showing the laminate insert package 500 of FIGS. 6, 7 and 8 integrated into a layer stack substrate 600 which has not yet been finished. More specifically, FIG. 8 illustrates an embedding insulating layer 605 of the layer stack substrate 600 which is configured to accommodate the laminate insert package 500 (synchronous buck circuit) 500 illustrated in FIGS. 6, 7 and 8. The embedding insulating layer 605 corresponds to embedding insulating layer 205 of the layer stack substrate 200 illustrated in FIG. 2, and reference is made to the previous description to avoid reiteration.

As depicted in FIG. 9, the embedding insulating layer 605 may be used for other connectivity in the rest of its area. To this end, a metal layer 606 attached to the surface of the embedding insulating layer 605 may have been structured into a desired electrical conductor pattern. The patterned metal layer 606 that can be seen on the top of the embedding insulating layer 605 will, after lamination of the layer stack substrate 600, form an internal substrate metal layer. Note that a top substrate insulating layer corresponding to the second substrate insulating layer 203 and a top substrate metal layer corresponding to the second substrate metal layer 204 of the layer stack substrate 200 are not yet applied to the semi-finished layer stack substrate 600 illustrated in FIG. 9, and thus are not depicted in FIG. 9. These layers and possibly further insulating and conducting layers are added before the layer stack substrate forming the electronic device is completed.

As mentioned earlier, embedding insulating layer 605 which accommodates the laminate insert package 500 may form part of a variety of different types of layer stack substrates such as e.g., double-sided or multi-layer PCB, SBU laminate structures, etc. Thus, the electronic device (or circuit), which in this example is e.g., a part of a voltage regulator or switch mode power supply circuit, may be realized on the basis of a variety of different layer stack substrates. Further, the embedding insulating layer 605 itself may realize different structures in the various layer stack substrates, e.g., a core layer of a PCB (which is typically equipped with double-sided structured metal foils) or a prepreg layer of a PCB.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. This application is intended to cover any adaptations or variations of the specific embodiments discussed herein, and the invention is intended to be limited only by the claims and the equivalence thereof.

What is claimed is:

1. An electronic device comprising:
   at least one semiconductor chip, each semiconductor chip defining a first main face and a second main face opposite to the first main face;
   a first metal layer coupled to the first main face of the at least one semiconductor chip;
   a second metal layer coupled to the second main face of the at least one semiconductor chip;
   a third metal layer overlying the first metal layer;
   a fourth metal layer overlying the second metal layer;
   a first through-connection extending from the third metal layer to the fourth metal layer, the first through-connection being electrically connected with the first metal layer and electrically disconnected from the second metal layer; and
   a second through-connection extending from the third metal layer to the fourth metal layer, the second through-connection being electrically connected with the second metal layer and electrically disconnected from the first metal layer.

2. The electronic device of claim 1 further comprising:
   a first insulating layer adjacent to the at least one semiconductor chip and between the first metal layer and the second metal layer.

3. The electronic device of claim 2, wherein the first insulating layer is at least one of a printed resin layer or a pre-punched plastic structure with or without reinforcement or a laminate prepreg layer.

4. The electronic device of claim 2, wherein at least parts of the third and fourth metal layers extend laterally outside a subregion to which the first metal layer, the first insulating layer and the second metal layer are laterally confined.

5. The electronic device of claim 2 further comprising:
   a second insulating layer between the first metal layer and the third metal layer, and a third insulating layer between the second metal layer and the fourth metal layer, wherein the second insulating layer and the third insulating layer form part of a layer stack of a printed circuit board, and the first metal layer, the first insulating layer, the second metal layer and the semiconductor chip form part of a laminate insert package embedded in the layer stack of the printed circuit board.

6. The electronic device of claim 5, wherein the laminate insert package extends laterally only in a subregion of the lateral extension of the printed circuit board.

7. The electronic device of claim 2 further comprising:

a second insulating layer between the first metal layer and the third metal layer, and a third insulating layer between the second metal layer and the fourth metal layer, wherein the second insulating layer and the third insulating layer form part of a layer stack of a core of a SBU (Sequential Build-Up) laminate structure, and the first metal layer, the first insulating layer, the second metal layer and the semiconductor chip form part of a laminate insert package embedded in the core of the SBU laminate structure.

8. The electronic device of claim 7, wherein the laminate insert package extends laterally only in a subregion of the lateral extension of the SBU laminate structure.

9. The electronic device of claim 1 further comprising:

a second insulating layer between the first metal layer and the third metal layer.

10. The electronic device of claim 9, wherein the second insulating layer is a laminate prepreg layer.

11. The electronic device of claim 1 further comprising:

a third insulating layer between the second metal layer and the fourth metal layer.

12. The electronic device of claim 11, wherein the third insulating layer is a laminate prepreg layer.

13. A laminate insert package comprising:

at least one semiconductor chip, each semiconductor chip defining a first main face and a second main face opposite to the first main face;

a first metal layer coupled to the first main face of the at least one semiconductor chip;

a second metal layer coupled to the second main face of the at least one semiconductor chip;

a first insulating layer adjacent to the at least one semiconductor chip and between the first metal layer and the second metal layer;

wherein the first insulating layer is a printed resin layer;

a first through-connection extending from a third metal layer, which overlays the first metal layer to a fourth metal layer, which overlays the second metal layer, the first through-connection being electrically connected with the first metal layer and electrically disconnected from the second metal layer; and a second through-connection extending from the third metal layer to the fourth metal layer, the second through-connection being electrically connected with the second metal layer and electrically disconnected from the first metal layer.

14. The laminate insert package of claim 13, wherein the first metal layer is structured to comprise first metal areas which are laterally outside of the region of the semiconductor chip and are opposed to metal-free areas of the structured second metal layer, and the second metal layer is structured to comprise second metal areas which are laterally outside of the region of the semiconductor chip and are opposed to metal-free areas of the structured first metal layer.

15. A method of manufacturing an electronic device comprising:

providing a laminate insert package comprising at least one semiconductor chip, a first metal layer coupled to a first main face of the at least one semiconductor chip and a second metal layer coupled to a second main face of the at least one semiconductor chip opposite to the first main face;

applying the laminate insert package over a third metal layer;

applying a fourth metal layer over the laminate insert package;

producing at least one first through-connection extending from the third metal layer to the fourth metal layer, the at least one first through-connection being electrically connected with the first metal layer and electrically disconnected from the second metal layer; and producing at least one second through-connection extending from the third metal layer to the fourth metal layer, the at least one second through-connection being electrically connected with the second metal layer and electrically disconnected from the first metal layer.

16. The method of claim 15 comprising:

avoiding to generate any first or second through-connection which is configured to electrically connect with both the first and the second metal layers.

17. The method of claim 15 comprising:

avoiding to produce any electrically conducting holes in the laminate insert package before producing the at least one first and second through-connections.

18. The method of claim 15, wherein at least parts of the third and fourth metal layers extend laterally outside a subregion to which the lateral extension of the laminate insert package is confined.

19. An electronic device comprising:

a layer stack made from a number of stack layers that are insulating and/or provided with conductor track structures;

a laminate insert package in the interior of the layer stack that extends laterally only in a subregion of the lateral extension of the layer stack, the laminate insert package comprising at least one semiconductor chip, a first metal layer coupled to a first main face of the at least one semiconductor chip, an insulating layer adjacent to the at least one semiconductor chip and a second metal layer coupled to a second main face of the at least one semiconductor chip opposite to the first main face;

a first through-connection extending from a third metal layer, which overlays the first metal layer to a fourth metal layer, which overlays the second metal layer, the first through-connection being electrically connected with the first metal layer and electrically disconnected from the second metal layer; and a second through-connection extending from the third metal layer to the fourth metal layer, the second through-connection being electrically connected with the second metal layer and electrically disconnected from the first metal layer.

20. The electronic device of claim 19, wherein the laminate insert package has a plate-type geometry.

* * * * *